(12) United States Patent
Keen

(10) Patent No.: US 7,126,645 B2
(45) Date of Patent: Oct. 24, 2006

(54) BACK-PORCH CLAMP

(75) Inventor: Ronald Thomas Keen, Indianapolis, IN (US)

(73) Assignee: Thomson Licensing, Boulogne (FR)

( * ) Notice: Subject to any disclaimer, the term of this patent is extended or adjusted under 35 U.S.C. 154(b) by 575 days.

(21) Appl. No.: 10/416,554

(22) PCT Filed: Nov. 21, 2001

(86) PCT No.: PCT/US01/43145

§ 371 (c)(1),
(2), (4) Date: May 12, 2003

(87) PCT Pub. No.: WO02/43375

PCT Pub. Date: May 30, 2002

(65) Prior Publication Data

US 2004/0027492 A1 Feb. 12, 2004

Related U.S. Application Data

(60) Provisional application No. 60/253,190, filed on Nov. 27, 2000.

(51) Int. Cl.
*H04N 5/16* (2006.01)
(52) U.S. Cl. ............ 348/695; 348/689; 348/691; 348/696; 348/697; 348/698
(58) Field of Classification Search ........ 348/691–698, 348/689; *H04N 5/16*
See application file for complete search history.

(56) References Cited

U.S. PATENT DOCUMENTS

| | | | | |
|---|---|---|---|---|
| 5,798,802 A | * | 8/1998 | Elmis et al. | 348/689 |
| 5,841,488 A | * | 11/1998 | Rumreich | 348/694 |
| 6,028,642 A | * | 2/2000 | Rinaldi et al. | 348/540 |
| 6,154,256 A | * | 11/2000 | Bruins | 348/533 |
| 6,195,133 B1 | * | 2/2001 | Bae | 348/678 |
| 6,529,248 B1 | * | 3/2003 | Tsyrganovich | 348/691 |
| 6,580,465 B1 | * | 6/2003 | Sato | 348/689 |
| 6,587,139 B1 | * | 7/2003 | Hirao | 348/194 |
| 6,967,691 B1 | * | 11/2005 | Keen | 348/695 |

FOREIGN PATENT DOCUMENTS

| | | |
|---|---|---|
| DE | 4215668 | 11/1993 |
| EP | 0944246 | 9/1999 |

OTHER PUBLICATIONS

Copy of Search Report dated May 31, 2002.

* cited by examiner

*Primary Examiner*—Brian P. Yenke
(74) *Attorney, Agent, or Firm*—Joseph S. Tripoli; Robert D. Shedd; William A. Lagoni

(57) ABSTRACT

The invention teaches a method, means and apparatus for clamping a back porch interval of a video signal including clamping a sync-tip level of said video signal to a variable reference voltage, comparing a back-porch voltage level of the sync-tip clamped video signal to a predetermined reference voltage, generating an error signal representative of the difference between the back-porch voltage level and the predetermined reference voltage, and adjusting the variable reference voltage in response to the error signal such that the error signal is minimized.

15 Claims, 4 Drawing Sheets

BACK-PORCH CLAMP

This application claims the benefit, under 35 U.S.C. §365 of International Application PCT/US01/43145, filed Nov. 21, 2001, which was published in accordance with PCT Article 21(2) on May 30, 2002 in English and which claims the benefit of U.S. patent application No. 60/253,190, filed Nov. 27, 2000.

FIELD OF THE INVENTION

The present invention relates to video signal processing.

BACKGROUND OF THE INVENTION

In video signal processing systems, either purely analog or digitized video, it is often desirable to implement a back-porch clamp to set the DC operating point of the signal to a predetermined reference voltage. To understand conventional practice, the recommended operation of the Broadcom 7020 IC 10 as shown in FIG. 1 is explained. A video signal V1 is buffered by a Video Op Amp 6 and is provided through a coupling capacitor 8 to the Video Input of IC 10 wherein it is digitized by an A/D Converter 12 and applied, in parallel, to a Video Decoder (VDEC) 14 and one input 16 of a keyed Comparator 18. The other comparator input 20 receives a predetermined reference voltage 22. The comparator output 24 is an error signal, which communicates the difference between the back-porch voltage level of comparator input 16 and the predetermined reference voltage 22. A Back-Porch Clamp (BPC) Pulse 26 is generated in the VDEC 14 and is used to enable the comparator 18 during the back-porch interval. Error signal 24 and BPC pulse 26 are applied to Pulse Width Modulator (PWM) 28, which outputs a duty-cycle modulated signal 30 during the BPC pulse interval and whose output is tri-stated to an essentially open-circuit condition during all other times. PWM output 30 is a pulse train operating at a horizontal rate, whose upper and lower levels are approximately zero volts and 3.3 volts respectively, and whose pulse width is approximately 50% when the comparator input 16 equals the predetermined reference voltage 22 and varies from near 0% to near 100% as comparator input 16 varies from maximally high compared to predetermined reference voltage 22 to maximally low compared to predetermined reference voltage 22. In this manner the PWM output 30 is of a polarity to provide negative feedback suitable to correct the DC restoration of the Video Input. PWM output 30 is low-pass filtered by resistor 32 and capacitor 34, this filtered value being applied to the Video Input through resistor 36. The corrected value of DC bias applied to Video Input is stored on coupling capacitor 8, which holds this value until the next horizontal back-porch interval, at which point a newly corrected bias is applied. However, when video is first applied to the A/D Converter 12 input, the bias voltage of the VDEC 14 input will likely be outside the dynamic range of the VDEC 14 and will thus make it difficult for the VDEC 14 to determine the location of horizontal sync and thus a properly timed BPC pulse will not be available. For this reason the VDEC 14 operates in a free-running mode until the feedback loop slowly responds and VDEC 14 finds the horizontal sync, measures how far the A/D value of the following back-porch is from the ideal value of 240 (out of 1024 A/D values) and corrects to adjust the back-porch level at comparator input 16 to the proper value. Afterwards the VDEC 14 operates in a locked mode to properly identify sync and the back-porch interval. There are several problems encountered when implementing a back-porch clamp as described above. First, a Video Op Amp is required to provide a very low output impedance driver in order to minimize an offset in the loop due to contamination of Video Input by the PWM signal. Second, the loop gain is determined by the inverse of the sum of resistors 32 and 36, and thus is relatively low. Third, the loop response stability is difficult to achieve as two dominant poles, associated with input capacitor 8 and filter capacitor 34, are employed, and initial stabilization of the loop is lengthy due to the difficulty of identifying the back-porch interval when the A/D Converter 12 and VDEC 14 are initially outside their optimal dynamic range. The present invention is directed towards solving these problems in a very cost effective manner.

SUMMARY OF THE INVENTION

The invention teaches a method of clamping a back porch interval of a video signal including clamping a sync-tip level of said video signal to a variable reference voltage, comparing a back-porch voltage level of the sync-tip clamped video signal to a predetermined reference voltage, generating an error signal representative of the difference between the back-porch voltage level and the predetermined reference voltage, adjusting the variable reference voltage in response to the error signal such that the error signal is minimized and temporarily disabling the adjusting of the variable reference after initial application of the video signal.

Figure 1:
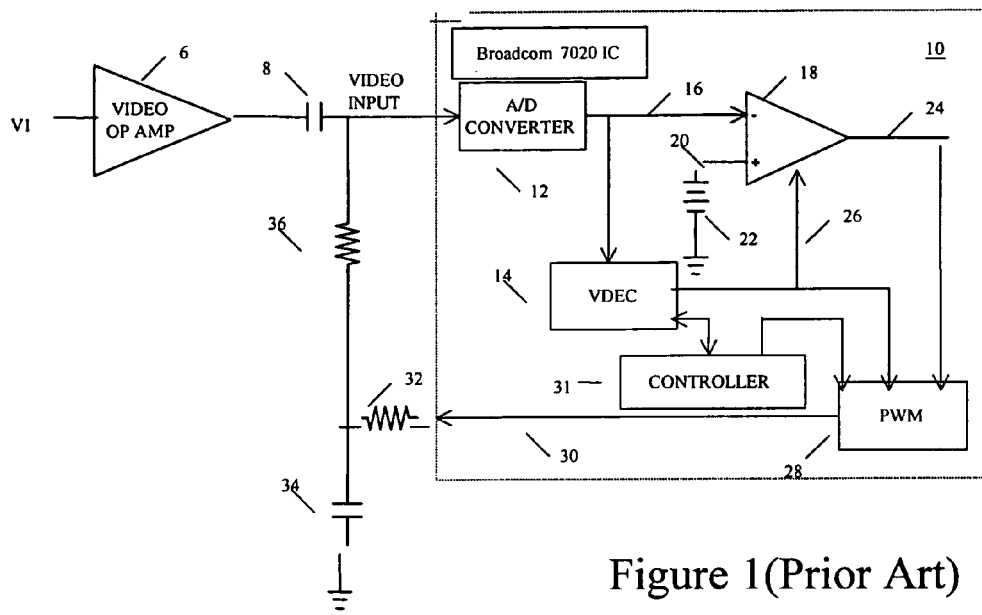
FIG. 1 is a block diagram of a conventional implementation of a back-porch clamp.

In the Drawings, the use of an identical reference designator in more than one figure indicates the same or similar features in the other figures.

DETAILED DESCRIPTION OF THE PREFERRED EMBODIMENT

The characteristics and advantages of the present invention will become more apparent from the following description, given by way of example.

Figure 3:
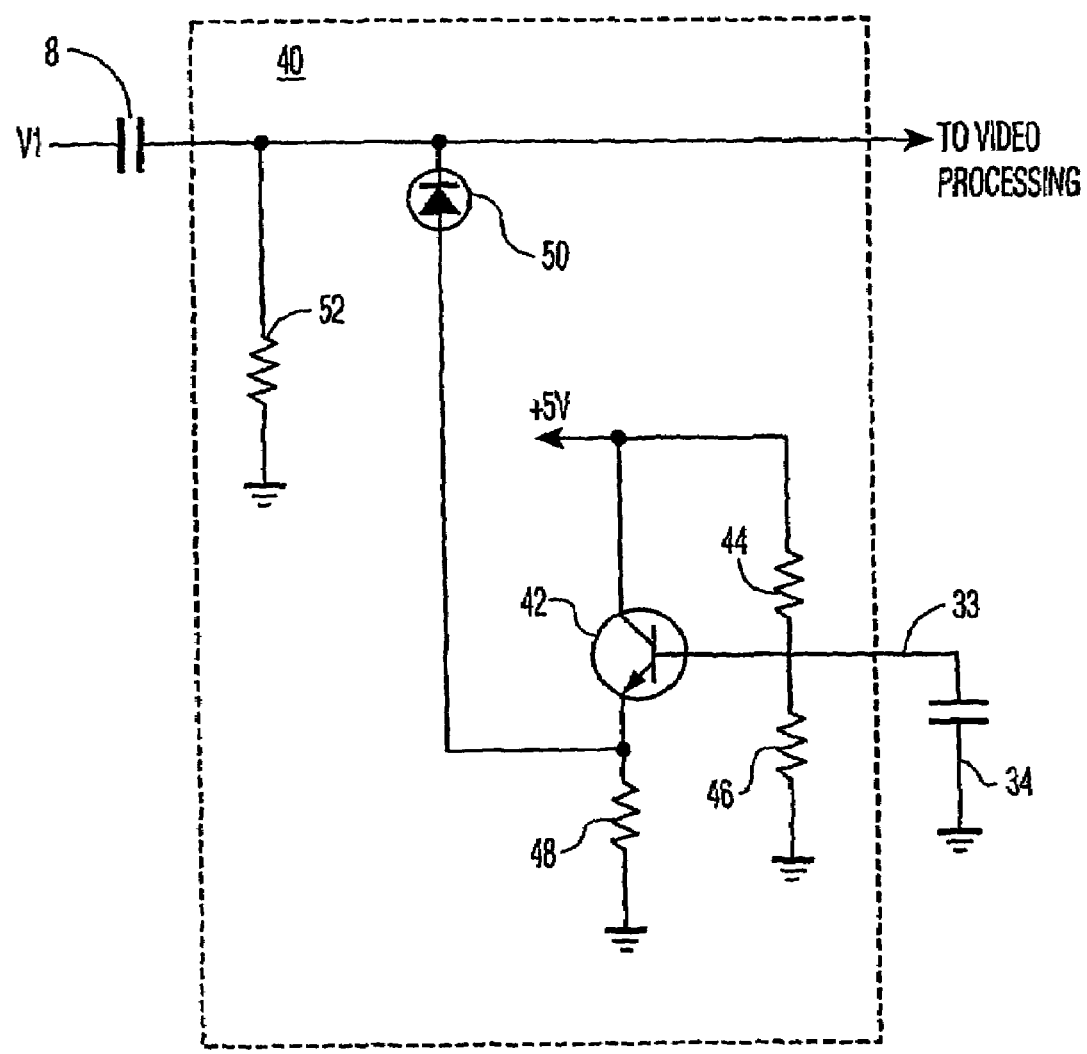
FIG. 3, illustrates an exemplary sync-tip clamp.

Referring to FIG. 3, an exemplary sync-tip clamp 40 used in conjunction with a video input to a video processing unit such as a Broadcom 7020 IC is shown. A transistor 42, circuitry on the base of the transistor, (i.e., a resistor 44, a resistor 46 and a capacitor 34), and an emitter resistor 48 provide a solid DC voltage. The clamp action Is performed by a diode 50, a leak resistor 52, and a coupling capacitor 8. The voltage to which the sync-tip will be clamped is determined by the divider ratio of resistors 44 and 46.

Figure 4:
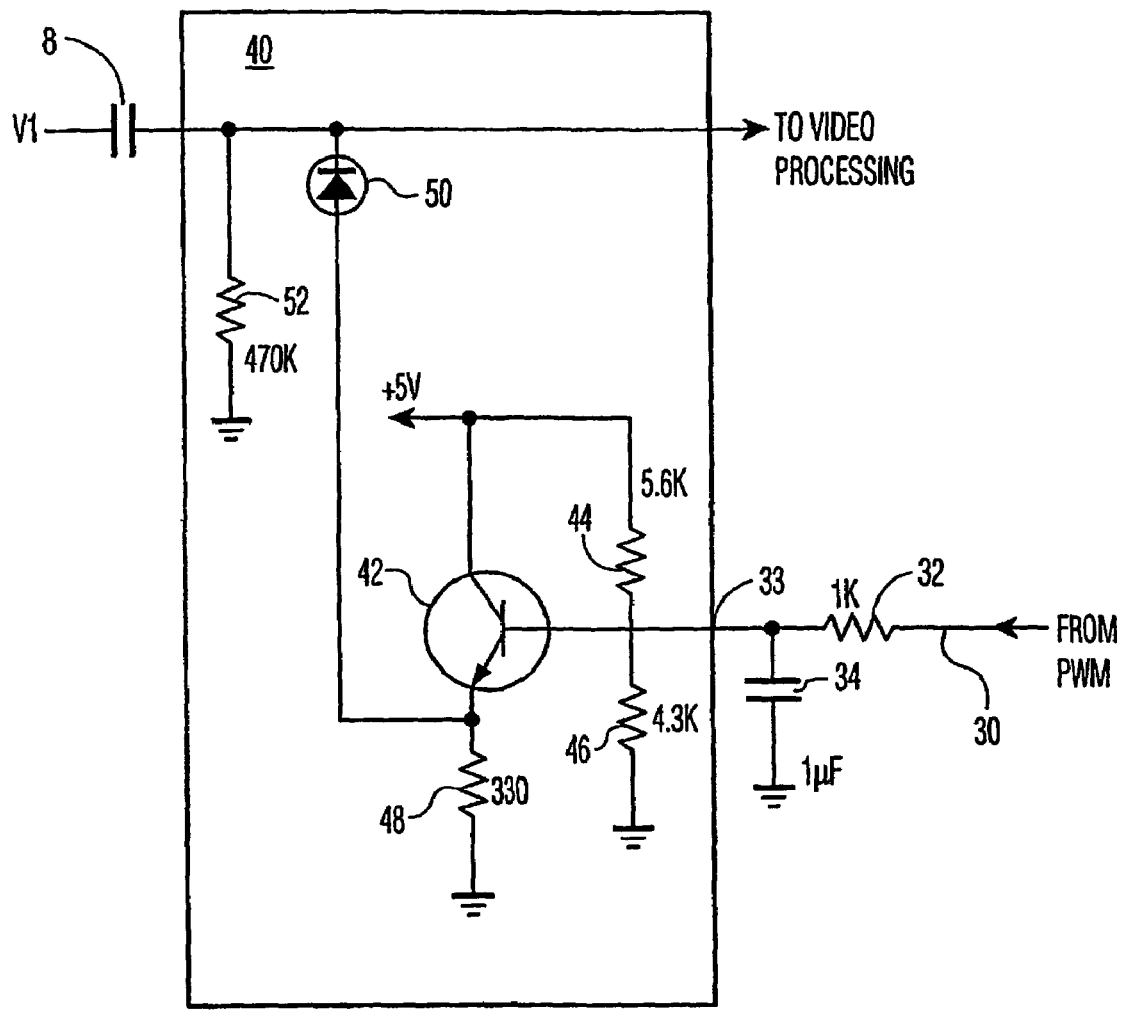
FIG. 4 illustrates a sync-tip clamp utilizing a variable voltage reference.

Referring now to FIG. 4, when PWM signal 30 is applied to the sync-tip clamp reference input 33 through resistor 32, the PWM output 30 will be low-pass filtered by capacitor 34 and will provide a variable reference to the sync-tip clamp. In this way the sync-tip level and thus the back-porch level of the video present at the cathode terminal of diode 50 can be adjusted by a variable reference in response to the duty cycle of PWM output 30.

Figure 2:
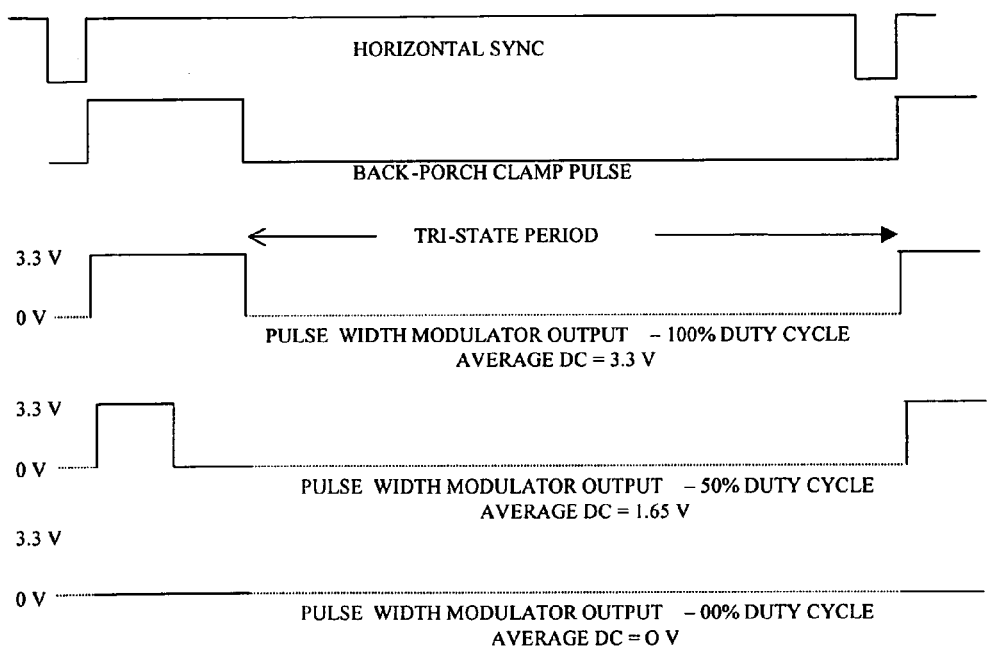
FIG. 2, illustrates various waveforms characterizing the PWM output signal
Figure 5:
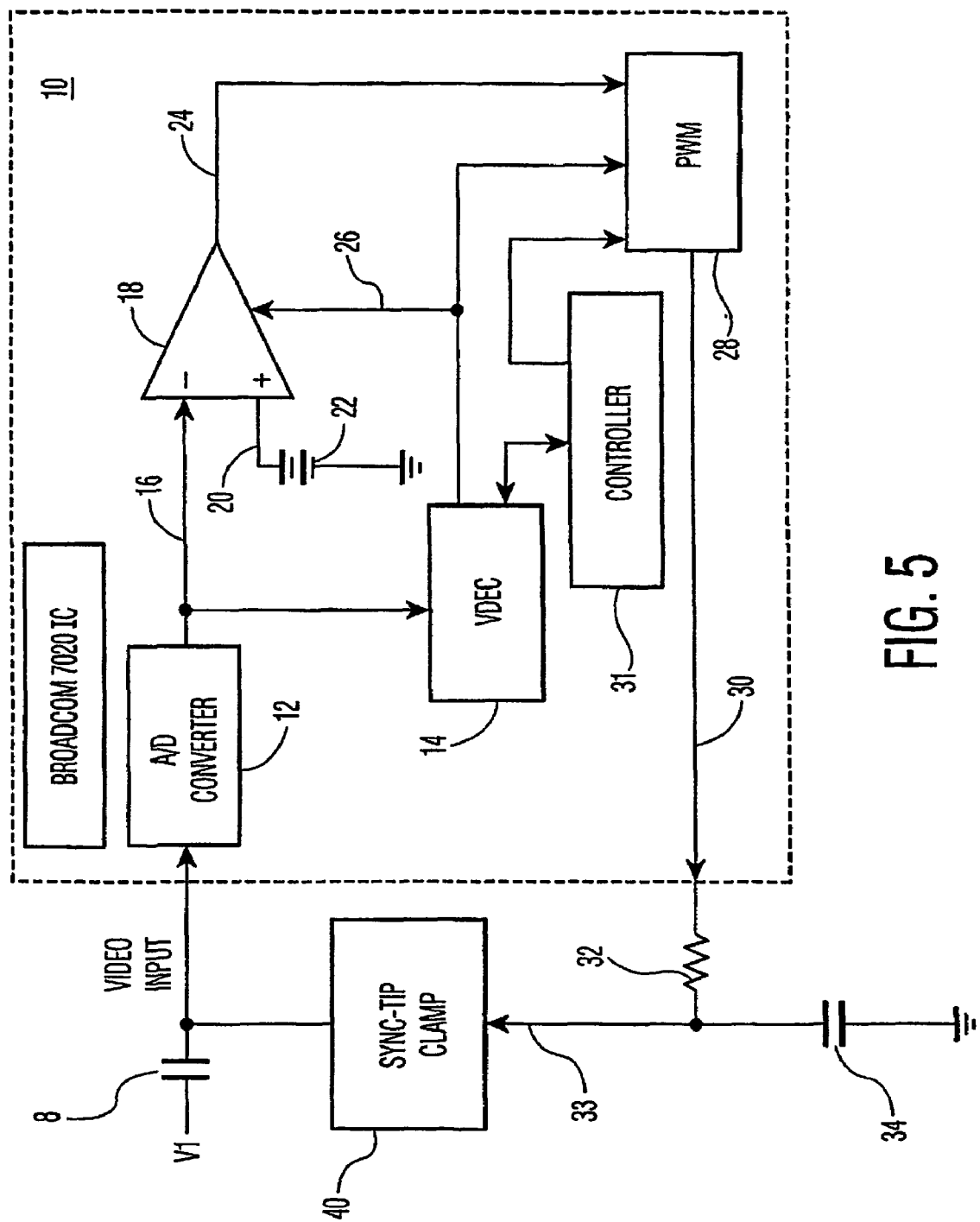
FIG. 5 is a block diagram, illustrating an embodiment of the present invention.

Referring now to FIG. 5, it should be noted that in the preferred embodiment of the present invention the PWM output 30 from the Broadcom 7020 IC 10 is applied to the sync-tip clamp input 33 through resistor 32. Upon initial application of a video signal, controller 31 maintains PWM 28 in a tri-state mode thus opening the feedback loop. By appropriate choice of the sync-tip clamp divider ratio of resistors 44 and 46 (shown in FIGS. 3 and 4), the Video Input will, almost instantaneously, be biased to approximately the correct level. In the present embodiment, the values of resistors 44 and 46 are chosen to develop approximately 1.6 Volts DC at the emitter of transistor 42 when PWM output 30 is held in the tri-state mode at initial application of a video signal, which biases the sync-tip clamped Video Input signal so as to present a back-porch voltage level of approximately 1.3 Volts. As VDEC 14 informs controller 31 it has acquired lock, controller 31 places PWM 28 in an active mode and the loop is closed during each subsequent BPC pulse interval. Stated differently, the closed loop adjustment of sync-tip clamp reference 30 is temporarily disabled after initial application of a video signal and is subsequently enabled after VDEC 14 has acquired lock. During the active video, the PWM is tri-stated so that the capacitor holds the DC level. Once the back-porch is restored to a value near 240, the video has been DC-restored and the PWM tracks the error signal 24 on every line. PWM output 30 goes through a series resistor 32 before being applied to capacitor 34 at sync-tip clamp reference input 33. This allows one to set how fast capacitor 34 integrates the PWM output 30. The pole formed by capacitor 34, resistor 32 and the parallel combination of resistor 44 and resistor 46 is the one dominant pole of the feedback loop. Although capacitor 8 still forms a pole, its pole is formed with the very low value of dynamic impedance of clamp diode 50 and is thus so high in frequency it can be ignored. If the Video applied to capacitor 8 is provided from a moderately high impedance driver, any offset due to clamp current will occur during the sync interval and thus will not produce an offset during the back-porch interval. In this manner, the requirement (and associated cost) for a very low output impedance video Op Amp is eliminated. The loop gain of this embodiment is determined by the ratio of the parallel combination of resistors 44 and 46 (shown in FIGS. 2 and 3) to resistor 32. As a result, independent design adjustment of loop gain and loop response is provided.

Although description of the preferred embodiments has been in terms of voltages, it should be understood that voltages and or currents could be used. While the present invention has been described with reference to the preferred embodiments, it is apparent that various changes may be made in the embodiments without departing from the spirit and the scope of the invention, as defined by the appended claims.

The invention claimed is:

1. Method of clamping a back porch interval of a video signal comprising:
   clamping a sync-tip level of said video signal to a variable reference voltage;
   comparing a back-porch voltage level of said sync-tip clamped video signal to a reference voltage;
   generating an error signal representative of the difference between said back-porch voltage level and said reference voltage;
   adjusting said variable reference voltage in response to said error signal for minimizing said error signal; and
   temporarily disabling said adjusting of said variable reference after initial application of said video signal.

2. The method of claim 1 further comprising the step of:
   digitizing said sync-tip clamped video signal prior to said comparison step.

3. The method of claim 2 wherein the step of adjusting said variable reference voltage comprises the step of:
   using a pulse width modulated signal to generate said variable reference voltage signal such that the duty cycle of said pulse width modulated signal is responsive to said error signal.

4. The method of claim 1 wherein the step of adjusting said variable reference voltage comprises the step of:
   using a pulse width modulated signal to generate said variable reference voltage signal such that the duty cycle of said pulse width modulated signal is responsive to said error signal.

5. The method of claim 1 wherein the step of adjusting said variable reference voltage further comprises the steps of:
   digitizing said sync-tip clamped video signal prior to said comparison step; and
   using a pulse width modulated signal to generate said variable reference voltage signal such that the duty cycle of said duty cycle modulated signal is responsive to said error signal.

6. Apparatus for adjusting a level of a video signal during a back-porch interval of a video signal comprising:
   means for adjusting a sync-tip level of said video signal in response to a variable reference voltage;
   means for comparing said back-porch level of said sync-tip level adjusted video signal during said sync-tip level adjusted video signal's back-porch interval to a reference voltage;
   means for determining a difference signal between said sync-tip level adjusted video signal during said sync-tip level adjusted video signal's back-porch interval to a reference voltage;
   means for determining a difference signal between said sync-tip level adjusted video signal's back-porch interval level and said reference voltage;
   means for controlling said variable reference voltage in response to said difference signal in such a way as to reduce said difference signal toward zero; and
   means for temporarily disabling said means for adjusting said sync-tip level of said video signal in response to said variable reference voltage after initial application of said sync-tip level adjusted video signal.

7. Apparatus recited in claim 6 further comprising:
   means for converting said sync-tip level adjusted video signal to a digital representation of said sync-tip level adjusted video signal.

8. Apparatus recited in claim 7 wherein:
   said means for controlling said variable reference voltage in response to said difference signal comprises a pulse-width modulator.

9. Apparatus recited in claim 6 wherein:
   said means for controlling said variable reference voltage in response to said difference signal comprises a pulse-width modulator.

10. Apparatus recited in claim 6, further comprising:
    means for converting said sync-tip level adjusted video signal to a digital representation of said sync-tip level adjusted video signal; and said means for controlling said variable reference voltage in response to said difference signal comprises a pulse-width modulator.

11. Apparatus for clamping a back-porch interval of a video signal comprising:
   a terminal for receiving said video signal;
   a keyed comparator for determining the difference between a level of said back-porch interval and a reference voltage, said keyed comparator having an output for providing a variable reference voltage;
   a sync-tip clamp, being configured to adjust the DC bias applied to said input video signal in an amount and of a polarity such as to cause said back-porch level to essentially equal said reference voltage in response to said keyed comparator output and a controller to temporarily disable said variable reference voltage after initial application of said video signal.

12. Apparatus as recited in claim 11 further comprising:
   an A/D Converter to digitize said video signal prior to said video signal being applied to said keyed comparator.

13. Apparatus as recited in claim 12, further comprising:
   a pulse width modulator, said pulse width modulator receiving at an input terminal said output from said keyed comparator and providing at said pulse width modulator output a variable duty cycle signal whose duty cycle is responsive to said output of said keyed comparator, said pulse width modulator output providing said variable reference voltage to said sync-tip clamp.

14. Apparatus as recited in claim 11, further comprising:
   a pulse width modulator, said pulse width modulator receiving at an input terminal said output from said keyed comparator and providing at said pulse width modulator output a variable duty cycle signal whose duty cycle is responsive to said output of said keyed comparator, said pulse width modulator output providing said variable reference voltage to said sync-tip clamp.

15. Apparatus as recited in claim 11, further comprising:
   an AID Converter to digitize said video signal prior to said video signal being applied to said keyed comparator; and
   a pulse width modulator, said pulse width modulator receiving at an input terminal said output from said keyed comparator and providing at said pulse width modulator output a variable duty cycle signal whose duty cycle is responsive to said output of said keyed comparator, said pulse width modulator output providing said variable reference voltage to said sync-tip clamp.

* * * * *